US010023489B2

(12) United States Patent
Hoppe et al.

(10) Patent No.: US 10,023,489 B2
(45) Date of Patent: Jul. 17, 2018

(54) SHAPED GLASS ARTICLE HAVING A PREDEFINED GEOMETRY PRODUCED WITHOUT USING A MOLD, METHOD AND USE OF THE SAME

(71) Applicant: SCHOTT AG, Mainz (DE)

(72) Inventors: Bernd Hoppe, Ingelheim (DE); Georg Haselhorst, Schmitten (DE); Volker Seibert, Hochheim (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 14/815,320

(22) Filed: Jul. 31, 2015

(65) Prior Publication Data
US 2016/0031737 A1 Feb. 4, 2016

(30) Foreign Application Priority Data

Jul. 31, 2014 (DE) .................. 10 2014 110 920

(51) Int. Cl.
C03B 23/023 (2006.01)
C03B 23/025 (2006.01)
(Continued)

(52) U.S. Cl.
CPC ...... C03B 23/0235 (2013.01); C03B 23/0086 (2013.01); C03B 23/023 (2013.01); C03B 23/0256 (2013.01); H05K 5/03 (2013.01)

(58) Field of Classification Search
CPC . C03B 33/091; C03B 33/093; C03B 19/1453; C03B 2205/67; C03B 23/26;
(Continued)

(56) References Cited

U.S. PATENT DOCUMENTS 4,088,470 A 5/1978 Bourg
4,326,872 A * 4/1982 Miltenberger .......... C03B 23/26
65/105

(Continued)

FOREIGN PATENT DOCUMENTS

CN 1374262 10/2002
CN 103237769 8/2013
(Continued)

OTHER PUBLICATIONS

GPI Design Guidelines for Molded Sheet Glass, GPInnovation Jul. 2013, 1 page.

Primary Examiner — Jodi C Franklin
(74) Attorney, Agent, or Firm — Ohlandt, Greeley, Ruggiero & Perle, L.L.P.

(57) ABSTRACT

A method for producing, without a mold, a shaped glass article having a predefined geometry is provided. The method includes providing a starting glass, supporting the starting glass, heating a portion of the starting glass so that in the portion a predetermined spatial viscosity distribution of the starting glass is obtained from $10^9$ to $10^4$ dPa·s and so that at points where the starting glass is supported a predetermined spatial viscosity distribution of the starting glass does not fall below $10^{13}$ dPa·s, and deforming the heated starting glass by action of an external force until the predefined geometry of the glass article is obtained.

21 Claims, 10 Drawing Sheets

(51) Int. Cl.
*C03B 23/00* (2006.01)
*H05K 5/03* (2006.01)

(58) Field of Classification Search
CPC ............ C03B 23/0013; C03B 23/0073; C03B 23/008
See application file for complete search history.

(56) References Cited

U.S. PATENT DOCUMENTS

| | | | |
|---|---|---|---|
| 4,891,055 A | 1/1990 | Shibaoka et al. | |
| 5,567,484 A | 10/1996 | Baumgart et al. | |
| 5,776,220 A * | 7/1998 | Allaire | B23K 26/0736 219/121.6 |
| 5,978,189 A | 11/1999 | Habu | |
| 5,984,159 A * | 11/1999 | Ostendarp | B23K 26/073 219/121.72 |
| 6,030,829 A * | 2/2000 | Dannoux | C03B 11/06 220/501 |
| 6,196,026 B1 * | 3/2001 | Anderson | B01L 3/5085 65/44 |
| 6,391,213 B1 | 5/2002 | Homola | |
| 6,664,503 B1 | 12/2003 | Hsieh et al. | |
| 8,051,679 B2 * | 11/2011 | Abramov | C03B 33/093 219/121.69 |
| 8,122,740 B2 * | 2/2012 | Lesche | B44C 3/046 219/121.6 |
| 9,470,641 B1 * | 10/2016 | Addington | G01N 21/958 |
| 2002/0121112 A1 | 9/2002 | Schroeder | |
| 2003/0209040 A1 | 11/2003 | Hashimoto et al. | |
| 2005/0233685 A1 * | 10/2005 | Fukase | B32B 15/02 454/1 |
| 2006/0022956 A1 | 2/2006 | Lengeling | |
| 2009/0256286 A1 * | 10/2009 | Lesche | C03C 23/0025 264/446 |
| 2010/0000259 A1 * | 1/2010 | Ukrainczyk | C03B 23/0235 65/104 |
| 2010/0107525 A1 | 5/2010 | Grzybowski et al. | |
| 2011/0084426 A1 * | 4/2011 | Nakamura | B28D 5/00 264/479 |
| 2011/0205485 A1 * | 8/2011 | Sonzogni | B29C 43/3642 351/124 |
| 2012/0098959 A1 * | 4/2012 | Addington | G01N 21/958 348/125 |
| 2012/0114901 A1 | 5/2012 | Uraji et al. | |
| 2012/0131961 A1 | 5/2012 | Dannoux | |
| 2012/0168992 A1 | 7/2012 | Bammer et al. | |
| 2013/0086948 A1 | 4/2013 | Bisson | |
| 2013/0298608 A1 * | 11/2013 | Langsdorf | C03B 23/0258 65/103 |
| 2013/0321903 A1 | 12/2013 | Grzybowski et al. | |
| 2014/0009429 A1 | 1/2014 | Verweg | |
| 2015/0266766 A1 * | 9/2015 | Dannoux | C03B 17/065 65/64 |

FOREIGN PATENT DOCUMENTS

| | | |
|---|---|---|
| DE | 3837552 A1 | 5/1989 |
| DE | 19603974 A1 | 8/1997 |
| DE | 102008048907 A1 | 4/2010 |
| DE | 102010020439 A1 | 11/2011 |
| DE | 102007012146 B4 | 11/2012 |
| DE | 102011050628 A1 | 11/2012 |
| DE | 102012020609 | 4/2014 |
| DE | 102014200921 A1 | 8/2014 |
| EP | 0690028 | 1/1996 |
| JP | S4995246 | 8/1974 |
| JP | 2012076997 A | 4/2012 |
| WO | 2005042420 A1 | 5/2005 |
| WO | 2011000012 A1 | 1/2011 |

* cited by examiner

SHAPED GLASS ARTICLE HAVING A PREDEFINED GEOMETRY PRODUCED WITHOUT USING A MOLD, METHOD AND USE OF THE SAME

CROSS-REFERENCE TO RELATED APPLICATION

The present application claims priority to German Patent Application No. 10 2014 110 920.1, filed on Jul. 31, 2014, which is incorporated herein in its entirety.

BACKGROUND OF THE DISCLOSURE

1. Field of the Disclosure

The disclosure relates to a method for producing a shaped glass article having a predefined geometry without using a mold, and further relates to the use of the glass article produced according to such method, and to a shaped glass article.

2. Background of the Disclosure

In some current processes, molds are employed for forming glass articles from flat glass, and the glass article will contact the mold towards the end of molding.

United States Patent Application Publication Nos. 2010/0107525 A1 and 2013/0321903 A1 discuss vacuum insulated glazing, in which bumps are formed in the surface of one of the glass panes of the vacuum insulated glazing. These bumps serve as spacers between the glass panes. The bumps are caused by density and volume changes in the glass by local heating. A drawback hereof is that mechanical stresses may be caused in the glass due to the volume change.

Methods for patterning glass surfaces are furthermore known from U.S. Pat. Nos. 5,567,484 A, 5,978,189 A, 6,391,213, and 6,664,503 A. All these methods relate to the patterning of glass sheets for magnetic or optical data storage media. According to U.S. Pat. No. 5,567,484 A, bumps are produced by laser irradiation for this purpose, similar as in the above citations relating to insulated glazing. The problem of mechanical stresses is addressed therein by a narrow process window in terms of laser pulse power. By contrast, according to U.S. Pat. No. 5,978,189 A, patterning is accomplished on the basis of evaporation of the glass material. According to U.S. Pat. No. 6,391,213 A, bumps or webs are first produced using a laser, which are preferentially attacked in a subsequent etching step, so that indentations are obtained at the locations of the bumps. According to U.S. Pat. No. 6,664,503 A, such similarly produced linear indentations are used as breaking lines to tailor glass sheets to the formats desired for data storage media.

According to European Patent Publication No. 0690028 A1 and United States Patent Application Publication No. 2003/209040 A1, a method for producing bumps by heating the glass is used for producing microlenses.

United States Patent Application Publication No. 2010/0000259 A1 substantially describes the bending of glasses preferably by using medium-wave IR radiation that is preferentially absorbed in the glass.

German Patent Application DE 10 2010 020 439 A1 discloses several methods for deforming individual glass articles, inter alia with the use of a mold and by selecting different temperatures at different points of the glass molding.

United States Patent Application Publication No. 2012/0114901 A1 describes a method for producing cover glasses, in which individual sheets are bent with an appropriately chosen temperature distribution and appropriately chosen radii of the mold.

The forming process is terminated as soon as the product contacts the mold over its entire surface.

International Patent Publication No. WO 2011/000012 A1 describes laser-heated bending pressing of materials.

All these methods either require molds of excellent surface quality which are very complicated and expensive to manufacture, or require reworking by grinding and polishing, which results in high complexity and high costs.

German Patent Application No. DE 10 2011 050628 A1 describes a bending method that does not use a mold, however, in this case the radiation sources are configured as radiant burners which have to be re-positioned mechanically depending on the desired bending geometry.

German Patent Application No. 10 2007 012146 B4 describes a laser beam and a scanning mirror for locally raising the temperature in the glass sheet to be deformed and to deform it through the action of gravity. In this case, temperature measurement is required since the deformation is directly controlled by the viscosity which is directly related to the temperature.

In case of thin flat glasses and small areas to be deformed it has been found by following the instructions of German Patent Application No. DE 10 2007 012146 B4 that gravity alone is no longer sufficient for deformation, since the surface tension causes the glass to keep its shape.

From International Patent Publication No. WO 2005/042420 A1, a method is known for producing a glass molding having a polygonal plate-shaped and optionally at least partially bulging base and at least one leg which is bent back along an edge of the base, comprising the steps of:
  providing a polygonal flat, optionally at least partially bulging glass pane;
  heating the edge on at least one side of the glass pane to the softening point of the glass using a linear burner;
  bending the glass rim which protrudes beyond the low-viscosity edge along the bending edge to a predefined angle as a leg of the glass molding;
  cooling the glass molding.

German Patent Application No. DE 38 37 552 A1 describes a method for producing a glass product having a smooth surface, wherein a glass plate is placed on a male mold which has dimensions corresponding to the inner dimensions of the glass product, so that the male mold contacts the inner peripheral edge portion of the glass plate. The outer peripheral portion to be deformed of the glass plate is heated to a temperature which is greater than that of a central portion of the glass plate, so as to be deformed on the male mold by its own weight. The glass plate deformed in this way is pressed by a female mold whose dimensions correspond to the external dimensions of the glass product.

International Patent Publication No. WO 2013/055587 A1 also discloses a method for deforming a flat glass.

BRIEF SUMMARY OF THE DISCLOSURE

An object of the disclosure is to provide a method for producing a shaped glass article having a predefined geometry without using a mold, which overcomes the drawbacks of the prior art mentioned. Another object of the disclosure is to provide for manufacturing of shaped glass articles of high surface quality in a cost-efficient and easy way, and in particular to avoid post-processing steps.

The object is achieved by a method for producing, without a mold, a shaped glass article having a predefined geometry, the method comprising at least the steps of:
  providing a starting glass;
  supporting the starting glass;
  heating a portion of the starting glass so as to obtain, in this portion, a predetermined spatial viscosity distribution of the starting glass from $10^9$ to $10^4$ dPa·s, in particular from $10^8$ to $10^4$ dPa·s, and so that at the points where the starting glass is supported a predetermined spatial viscosity distribution of the starting glass does not fall below $10^{13}$ dPa·s, wherein the heating is accomplished using at least one laser beam; and
  deforming the heated starting glass by action of an external force until the predefined geometry of the glass article is obtained, wherein said portion is raised or lowered with respect to the surrounding regions so that a local elevation or depression is obtained.

The deformations produced by the method of the disclosure typically have a cup-shaped form so that an elevation on one side corresponds to a depression on the other, opposite side.

The term "without a mold" in the sense of the disclosure in particular means that the heated portion does not come into contact with a mold.

Advantageous alternate embodiments of the disclosure are also described herein.

Preferably, a flat glass is used as the starting glass, which is deformed by the method of the disclosure to obtain a shaped glass article.

A soda-lime glass, borosilicate glass, or aluminosilicate glass is preferably used as the starting glass. Furthermore, glasses that may be converted into glass ceramics by ceramization may be used as well. Therefore, in addition to the glass articles produced according to the disclosure, the disclosure also relates to glass ceramic articles produced accordingly. Suitable glasses for this purpose are lithium aluminosilicate glasses, inter alia.

According to a further embodiment of the method, the starting glass is preheated. Preheating is preferably performed in a separate furnace.

Preferably, heating parameters, in particular the viscosity of the starting glass to be obtained in the portion, and deformation parameters, in particular deformation time and deforming force are chosen so that deformation ceases when the starting glass has assumed the predefined geometry.

According to a further embodiment of the method the heating of the portion is accomplished using at least one burner, or by IR radiation.

The heating of the portion may as well be effected using at least one laser beam, in which case the portion is particularly preferably scanned with a frequency of the laser beam of at least 2 Hz.

The entire portion may be heated simultaneously or in a temporal sequence.

Preferably, heating is effected along a closed line.

The heating may be performed so that a predetermined thermal gradient is adjusted between the portion and the other regions of the starting glass.

Preferably, the thermal gradient is measured by suitable measuring methods, in particular using a thermal imaging sensor, and/or the deformation is measured by suitable measuring methods, in particular using optical sensors and/or acoustic sensors.

The further force may in particular act by subjecting the heated starting glass to an overpressure and/or an under pressure.

The further force may be exerted by a pressure difference across the starting glass.

Favorable forces are those that do not act in regions of the glass having viscosities $<10^{13}$ dPa·s.

The resulting glass article preferably has no defects (pits) of a size greater than 1 µm, in particular not greater than 0.1 µm.

By reversing the action of the force under a new temperature/viscosity profile, other geometries may be produced as well, in particular geometries that include areas protruding beyond the level of the starting glass sheet within portions that have been lowered before.

According to the disclosure, the glass article produced according to the method of the disclosure may be used for electronic devices, in particular as part of a casing or of a screen.

DETAILED DESCRIPTION OF THE DISCLOSURE

Figure 1:
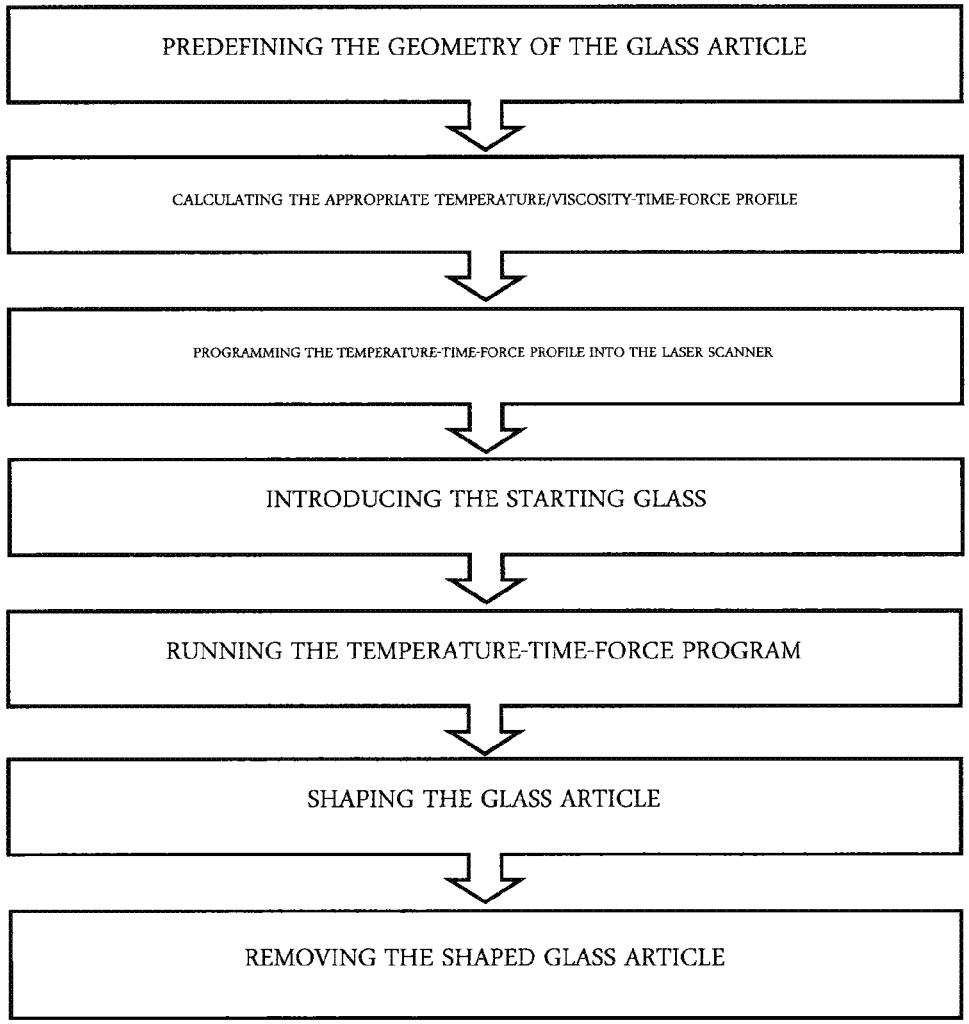
FIG. 1 shows a flow chart of preferred method steps.

FIG. 1 shows, by way of example, a flow chart of preferred method steps for producing, without a mold, a shaped glass article that has a predefined geometry. First, the geometry of the glass article to be shaped was predetermined (predefined). Then a suitable temperature (viscosity)-time-force profile was calculated. That is, it was determined which portion of the starting glass has be heated how long and to what temperature under which force applied to obtain the desired deformation. The heating was to be performed using a laser beam. That means, a suitable laser scanner was programmed so as to achieve the desired temperature (viscosity)-time-force profile. The force is set through the amount of pressure difference across the glass sheet. The starting glass (flat glass) was provided, was supported at appropriate points, and the temperature (viscosity)-time-force program was executed during which the starting glass deformed into the shaped glass article of predefined geometry. In a final step, the shaped glass article was removed.

Figure 2:
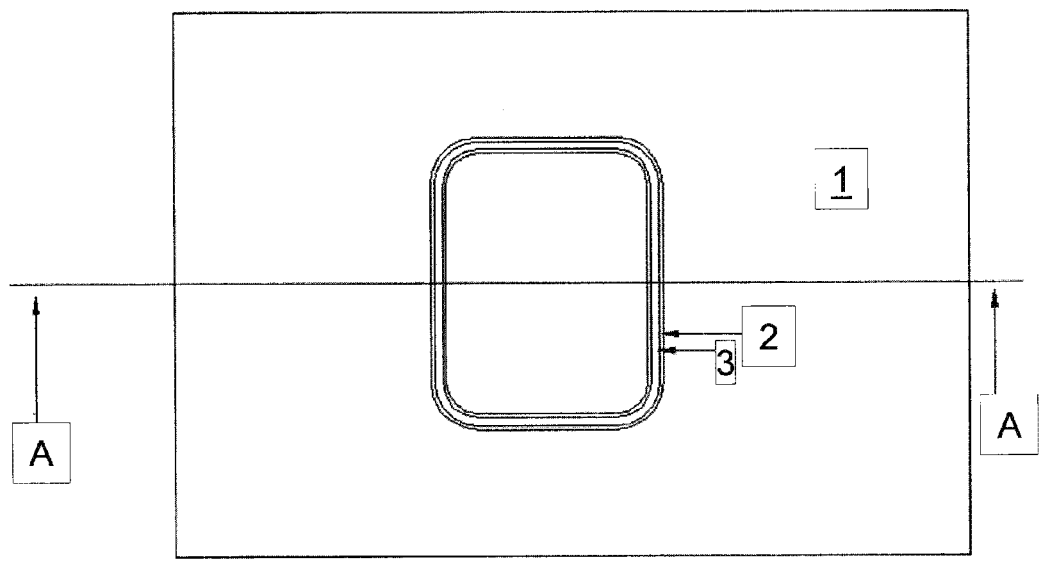
FIG. 2 shows the creation of a depression in a flat glass which is supported at the periphery while being deformed and a glass article so obtained, in a top plan view in the upper part and along sectional line A-A in the lower part.
Figure 2:
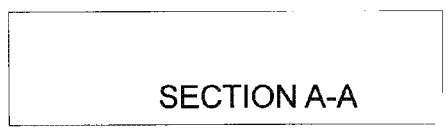
Figure 2:
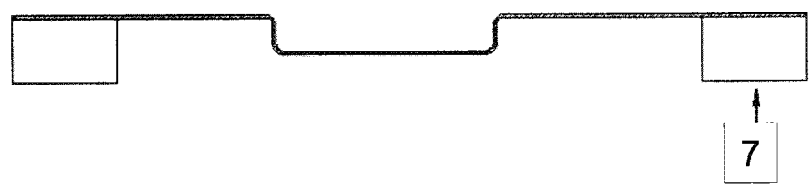

FIG. 2 shows the creation of a depression in an aluminosilicate flat glass (shaped flat glass 1) which was supported at its periphery while being deformed. In portion 2, the starting glass (flat glass) was heated to a temperature so that a viscosity from $10^7$ to $10^{13}$ dPa·s was obtained in this portion, and in portion 3 to a temperature so that a viscosity from $10^4$ to $10^8$ dPa·s was obtained in this portion. The heating was performed in a manner so that in the regions where the starting glass was supported the viscosity of the starting glass did not fall below $10^{13}$ dPa·s. The so heated starting glass was deformed under the action of a force caused by a pressure differential across the glass sheet until the predefined geometry of the glass article was obtained.

Figure 3:
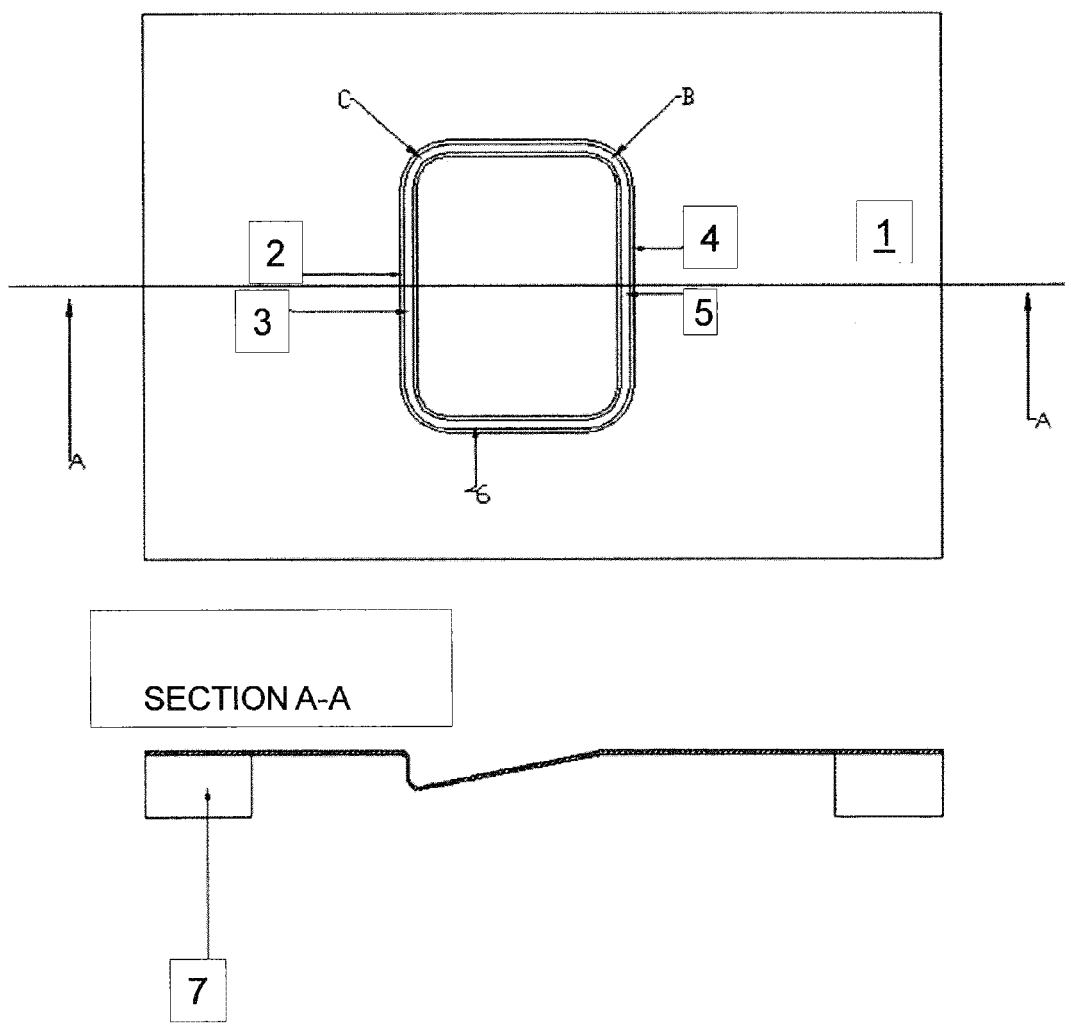
FIG. 3 shows the lowering of a portion in a flat glass which is supported at the periphery while being deformed and a glass article so obtained, in a top plan view in the upper part and along sectional line A-A in the lower part.

FIG. 3 shows the creation of an asymmetric depression in a flat glass (shaped flat glass 1) which was supported at its periphery while being deformed. The starting glass (flat glass) was heated to different temperatures in portions 2, 3, 4, 5, and 6, so that different viscosities were obtained in these portions. The heating was performed in a manner so that in the regions where the starting glass was supported the viscosity of the starting glass did not fall below $10^{13}$ dPa·s. The so heated starting glass was deformed under the action of weight force until the predefined geometry of the glass article was obtained.

Figure 4:
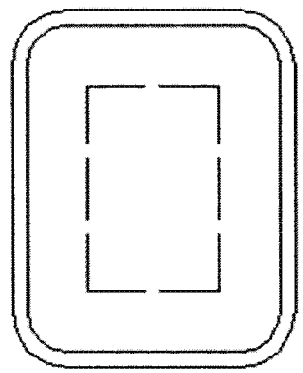
FIG. 4 shows the lowering of the edge portion of a flat glass which is supported at an inner area while being deformed, and a glass article according to the disclosure, in a top plan view in the upper part and along a sectional line in the lower part.
Figure 4:
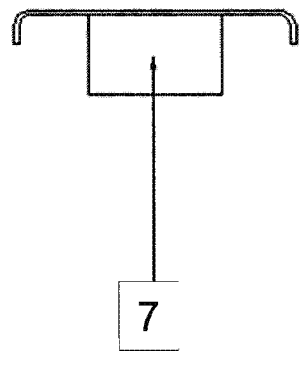
Figure 6:
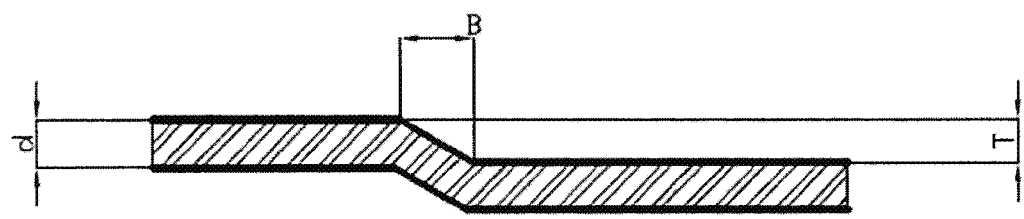
FIG. 6 schematically illustrates where some dimensions of a deformation are measured, namely d=thickness of the starting glass, B=width of the zone heated in the starting glass, and T=depth of a lowered area.

FIG. 4 illustrates deforming of the edge portion of a flat glass which was supported in a central area while being deformed.

The deformation process was solely controlled by subjection to the time-viscosity-force profile, i.e. without surface contact to a mold, so that expensive molds can be dispensed with.

According to the disclosure, a flat glass (starting glass) was brought to a temperature, at least partially, that corresponds to a viscosity of $10^{13}$ dPa·s. The flat glass was supported in a region that was not intended to be deformed. In this region, the glass remained at a viscosity >$10^{13}$ dPa·s, so that no damage to the glass surface could result from the support. In some portions, the viscosity was now reduced to such an extent that portions of the flat glass "sagged" or lowered. For this purpose, the minimum viscosity values may be in a range around $10^8$ dPa·s or even around $10^5$ dPa·s, depending on the thickness of the glass and the desired degree of deformation and the weight force acting on the region to be deformed. The time-viscosity-force profile was chosen so that the deformation ceased at a time at which the desired shape or a desired intermediate shape was obtained.

Depending on the predefined geometry of the glass article to be produced, very high viscosity gradients and thus temperature gradients are required, which were preferably achieved by heating using laser radiation (laser scanner). By selecting suitable laser sources it is possible to employ different wavelengths which will penetrate to different depths due to their different absorption in the starting glass and will thus be effective in different depths of the starting glass. However, other heat sources were also used, especially when a slight deformation was desired that required a small viscosity gradient.

For monitoring the temperature distribution, a planar thermal imaging sensor was preferably used.

It is also possible to use sensors which detect the position of the deformed glass, to control deformation. In one embodiment, such sensors were used to determine the final geometry. In a further embodiment, such sensors were used to control the process. In particular ultrasonic sensors and/or optical sensors were used.

The flat glass to be shaped was supported by a frame, so that portions in the central area of the flat glass were able to deform. However it is likewise possible to support the flat glass in the center so that the edges can be deformed. In any case the support surface was dimensioned so that the glass sheet was not deformed in the immediate vicinity of the support surface.

Depending on the shape to be achieved it may be advantageous to heat specific points on the flat glass in a temporal sequence in order to use the glass of high viscosity as a holder for the glass to be shaped. The respective bending lines may then be adjusted to a medium viscosity, e.g. in a range from $10^9$ dPa·s to $10^8$ dPa·s, depending on the lever length. In the transition region between bending lines and lowered areas, for example between points B and C in FIG. 3, the viscosity has to transition continuously.

Figure 5:
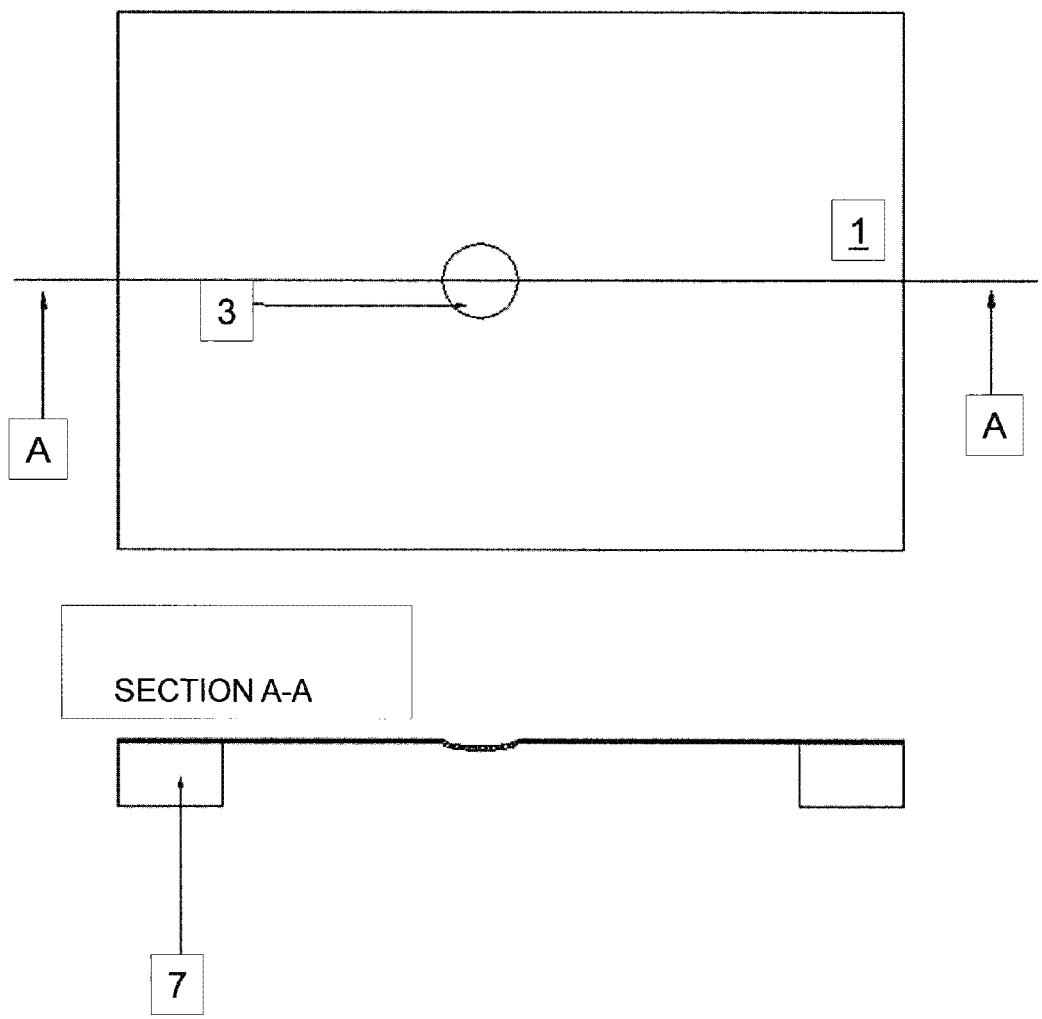
FIG. 5 shows the shaping of a flat cap in a flat glass and a glass article according to the disclosure, in a top plan view in the upper part and along sectional line A-A in the lower part.

The described method is enabled to produce any desired geometries producible by causing areas to lower. For example, FIG. 5 shows the creation of a flat spherical cap in a flat glass 1, which may be used for guiding the finger on a touch-sensitive screen (touch screen), for example. In this case, heating was effected in portion 3.

The so shaped glasses are preferably used as cover glasses in mobile or non-mobile electronic devices.

The following table lists surface properties of glass articles according to the disclosure, which were shaped according to the method of the disclosure from flat glasses of a size of 1150×850 mm:

| | | |
|---|---|---|
| Thickness | 0.7 mm | 1.1 mm |
| Thickness tolerance in a glass article | <40 μm | <50 μm |
| Thickness variation between different glass articles | <50 μm | <50 μm |
| Waviness of the glass article as a whole (warp) | <0.05% | <0.05% |
| Upper surface waviness* | <150 nm | <150 nm |
| Lower surface waviness* | <150 nm | <150 nm |

*These values were determined using a Zeiss Surfcom 1400 measurement device with a 0.8 mm/8 mm blocking filter; sample size 280 × 280 mm.

Glass articles of the disclosure or glass articles produced according to the disclosure preferably exhibit a thickness tolerance of <50 μm, a thickness variation of <50 μm, a warp of <0.05%, and a waviness of <150 nm (the last two values refer to the non-deformed area of the glass article).

For the deformations of glass articles described so far a portion of the glass was deformed which itself was not heated and thus softened. For this purpose, frame-shaped portions are heated, and the inner region enclosed by the frame-shaped portions is lowered or raised. However, the disclosure in particular contemplates to deform only heated regions and to keep adjacent regions of the starting glass in their original position. An advantage offered herein is to be able to control the shape of the elevation or depression through the viscosity distribution produced by the laser, which can be adjusted to virtually any desired distribution.

This permits to produce a shaped glass article which has a sheet-like basic shape and a local deformation in form of a shaped portion which defines an elevation 10 on one side and a depression 11 on the opposite side, wherein the surface of the deformation includes a region of convex curvature which transitions into a region of concave curvature. The height of the elevation 10 or the depth of the depression 11 is preferably at least 0.1 mm, in order to achieve well perceptible haptic properties. On the other hand, the heights or depths are not greater than the width of the deformation. The minimum wall thickness of the deformation remains at least 0.5 times the thickness of the sheet-like glass article. With these features deformations are obtained which guarantee a sufficient mechanical stability of the glass article. In case of a line-shaped elevation or depression, the width is the width of the line. In case of a circular, e.g. spherical cap-shaped elevation or depression, the width corresponds to the diameter of the deformation. For dot-shaped or circular elevations and depressions it is furthermore preferred that the height of the elevation or the depth of the depression does not exceed half the diameter of the deformation. If as stated above only the heated portions of the starting glass are deformed and the surrounding regions are left in their position, i.e. are not raised or lowered, the deformation will usually have a continuously curved or dome-shaped surface. In particular the center of the deformation, i.e. the center of the elevation or depression will typically have a curved or dome-shaped surface as well.

The height of the elevation or depth of the corresponding depression is preferable between 0.1 and 2.5 mm.

Furthermore, by controlling the viscosity distribution the minimum curvature radius of the curvature at the edge of the deformation may generally be smaller than the minimum curvature radius in the center of the deformation. The center of the deformed area will be convex in case of an elevation and concave in case of a depression. Accordingly, the inventive method permits to produce a shaped glass article which has a sheet-like basic shape and a local deformation in form of a deformed portion which defines an elevation 10 on one side and a depression 11 on the opposite side, with a height of the elevation 10 or depth of the depression 11 preferably between 0.1 and 2.5 mm. The surface of the deformation includes a region of convex curvature which transitions into a region of concave curvature, and, as mentioned above, the minimum curvature radius of the curvature at the edge of the deformation is smaller than the minimum radius of curvature in the center of the deformation.

With these properties, an elevation can be produced, for example, which has a shape close to that of a spherical cap but without sharp edges due to the curvature at the edge.

Usually, the minimum curvature radius at the edge will preferably be between 0.5 mm and 3 mm, without being limited to the illustrated exemplary embodiments.

As an application example, the creation of tactile perceptible characters on glass surfaces, in particular Braille characters, will be described below. Braille characters are defined in DIN 32976.

The processing by locally heating glass bodies using laser radiation for selectively causing contact-free shaping can be illustrated with the generation of Braille symbols, by way of example. In this implementation embodiment, a stationary irradiation zone is established with lasers in a range from 300 to 11,000 nm, preferably with a radiation in the far infrared, from 9,800 to 10,400 nm. A laser beam of a diameter adjusted to the target geometry is sequentially directed to the relevant areas of the glass substrate to be shaped, with modes that will be explained in more detail below. If now an under pressure is applied in the irradiation region on the side opposite to the irradiation side of the laser beam, local elevations with heights from about 100 µm to 600 µm will be formed when the glass is heated up into the softening range.

The laser beam may be directed to the individual positions for instance by using galvanometer scanners, diffractive/refractive fixed optical systems, by displacing an X/Y table in case of a laser beam statically focused by means of lenses, or by a combination of these implementation variations.

In any kind of sequential processing, the laser radiation is preferably significantly reduced or even turned off during the periods when skipping to another irradiation region, in order to avoid irradiation and thus heating of the glass in the intermediate areas which could lead to undesirable contour extensions. In case of a singular irradiation of individual increments, because of the inevitable formation of heat affected zones, specific processing strategies may be advisable to prevent an impact on subsequent irradiation positions due to heat conduction in the glass volume which would result in geometrical deviations from the target value. To this end, individual elements are irradiated by shifting the processing position for instance by such distances that heat conduction into the surrounding glass volume leads to a drop in temperature and thus to an increase in viscosity before a directly adjacent element is processed, so that preferably the geometric dimensions of the deformed area will not be affected, while the laser parameters are maintained. Alternatively, spatially resolved laser power modulation may be implemented so that direct thermal interference of processed points can be significantly reduce. It is moreover possible, by randomized or sequential short-term irradiation of all or a plurality of individual elements in a fast repetitive sequence, to accomplish quasi-simultaneous heating with a continuously raising temperature up into the softening range of the respective glass.

Generally, without being limited to the example of Braille characters, it is therefore contemplated according to one embodiment of the inventive method that the heating of one or more portions of the starting glass is accomplished by means of a laser and with a locally and/or temporally varying laser power. In particular when producing at least two laterally spaced-apart deformations in form of depressions or spaced elevations, as in the case of the dots of Braille characters, the laser power may be reduced or preferably even switched off while the laser beam sweeps over the intermediate space between the portions that are heated by the laser beam for producing the individual deformations. By locally or temporally varying the laser power it is moreover possible to obtain a predefined viscosity distribution in the glass in a direction along the surface before or during the shaping.

Furthermore, by using an optical system, the laser beam may be laterally distributed over the surface of the starting glass so that the predefined viscosity distribution is achieved. For this purpose, appropriate refractive and/or diffractive components may be employed in the optical system.

In the specific example of Braille characters, preferably with a glass thickness of about 0.3 mm to 1 mm typical for this use, according to one embodiment of the inventive method the irradiation with laser radiation is performed in a range of wavelengths from 9.6 to 10.6 µm with intermittent shaping of the individual elements, preferably with a focus diameter from 0.3 to 1.5 mm, typically with an applied laser power from about 0.015 to 0.15 W/cm$^2$. During the phase of through heating of the glass, this value may temporarily be slightly higher but is preferably limited by the damage threshold of the respective glass. The applied under pressure for exerting the required shaping force is preferably chosen in a range from −0.1 bar to −0.7 bar, or in a range from 0.1 bar to 0.7 bar below the ambient pressure.

In order to be able to process, in this manner, even glasses having a high thermal expansion coefficient without causing cracking, thermal preconditioning to the transformation range of the glass or to some temperature range below might be useful. This may also be accomplished using laser radiation (e.g. with a large focus diameter in a scanning mode) or by conventional heating technologies, e.g. a convective heating device. Generally, without being limited to the exemplary embodiment of producing Braille characters it is therefore contemplated according to a refinement of the inventive method that the starting glass is preheated, and such preheating is effected at least in a region which includes the deformation to be produced or the region of the starting glass that is to be heated for producing the deformation. The heating is preferably performed up to a temperature of at least 300° C., so that the temperature may exceed the transformation temperature $T_g$ of the glass but remains below the temperature of the softening point at which the glass reaches a viscosity of $10^{7.6}$ dPa·s.

Figure 7:
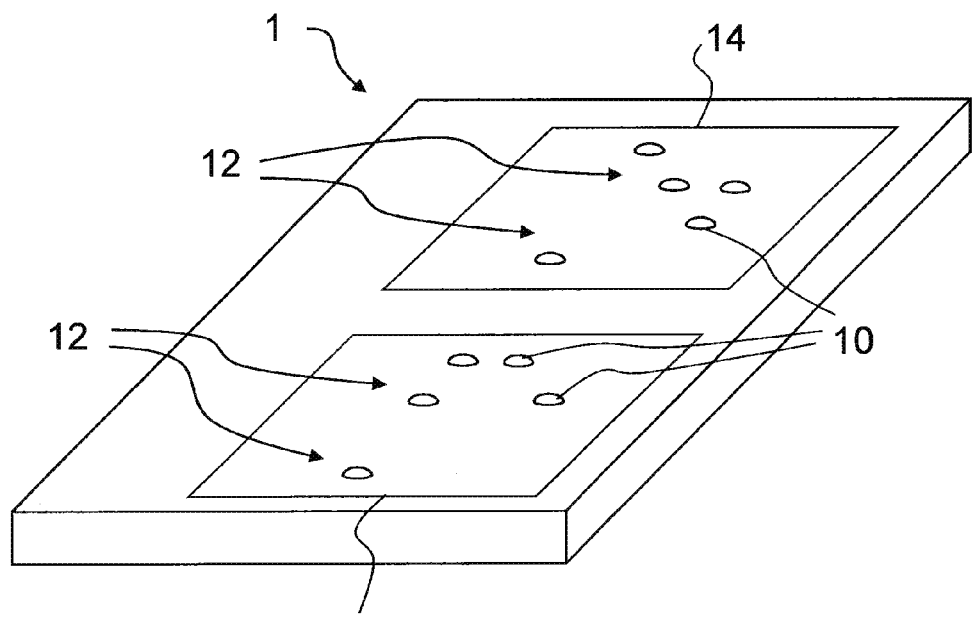
FIG. 7 shows a glass article with Braille characters formed therein.

FIG. 7 shows an example of a product producible with the method of the disclosure. Using the method, glass article 1 in form of a flat glass has been provided with laterally spaced elevations 10 which are arranged so as to represent Braille characters 12. These Braille characters may in particular indicate control fields 14. These control fields 14 may for instance be switch buttons by means of which a device equipped with the glass article can be turned on and off. In this case, one control field may be marked with "ON", the other with "OFF", as in the example shown in FIG. 7. Touch keys by means of which the device can be turned on and off may be provided on or below the control fields.

According to yet another embodiment of the disclosure, a glass article as exemplified in FIG. 7 is distinguished by the following features: The glass surface has elevations 10 in form of Braille characters, wherein the elevations 10 represent Braille dots and have a height in a range from at least 50 µm and preferably up to 800 µm. Elevations 10 are monolithically formed with the surrounding glass material and consist of the same glass. Furthermore, the surface of the elevations is fire polished.

In the case of Braille characters, the intended elevations 10 are dot-shaped or in form of elevations with a circular edge.

Figure 8:
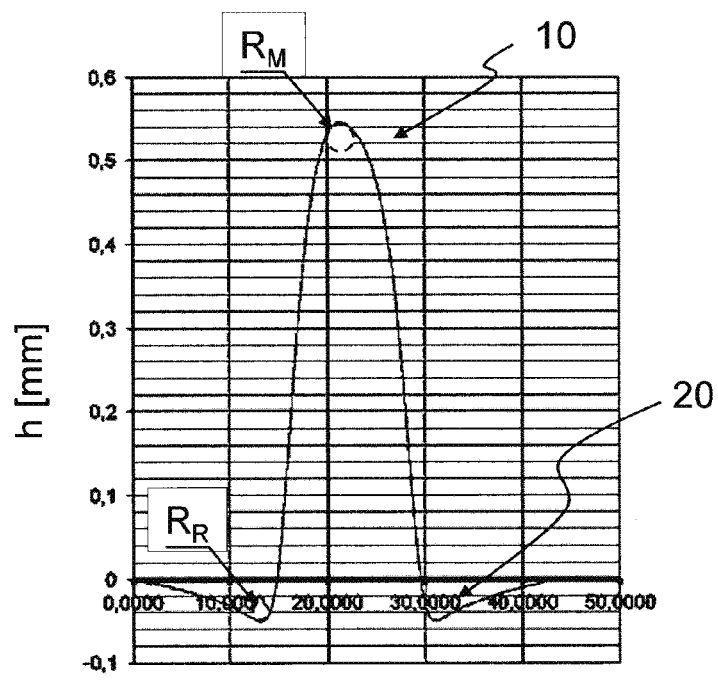
FIG. 8 shows a contour scan across a local elevation.

Advantageously, as stated before, the surface of the deformation includes a region of convex curvature which transitions into a region of concave curvature, and the minimum curvature radius of the curvature at the edge of the deformation is smaller than the minimum radius of curvature in the center of the deformation. In case of an elevation 10 which is useful for forming Braille characters, a central convex curvature transitions into a concave curvature at the edge. This is illustrated in FIG. 8 in a contour scan of an elevation 10 that can be used for Braille characters. The contour scan extends over a distance x of 45 mm across the elevation 10. Elevation 10 has a maximum height h of about 0.55 mm. Also indicated are circles of curvature at the locations of maximum curvature in the center and at the edge of the deformation. The circles of curvature are designated by the respective radii of curvature $R_M$ and $R_R$. As can be seen from the figure, the circle of curvature in the center and thus the radius of curvature $R_M$ is greater than the curvature circle with radius $R_R$ at the edge of elevation 10. Furthermore it is apparent that a peripheral reverse deformation may be formed when using the method according to the disclosure. Thus, a peripheral indentation 20 may exist surrounding the elevation 10, like in the example of FIG. 8. In case of a depression 11, on the other hand, a peripheral elevation may be formed. These peripheral deformations may be very advantageous, like the smaller radii of curvature at the edge, to improve the haptic perceptibility of the deformation. This is because the perceived height of the elevation 10 increases due to the peripheral indentation, although the elevation actually does not protrude further from the surface.

Advantageous applications are moreover obtained for line-shaped elevations or depressions. One exemplary embodiment of such a line-shaped feature will be described below.

As an exemplary variation of an embodiment comprising local line-shaped geometries, the shaping of tactile aids (tactile stripes) will be described below, which due to their elevated nature assist in manual positional guidance on control surfaces, for example of control units in the passenger compartment of motor vehicles, or in the field of consumer electronics. Here, the appropriate glass components typically have a thickness from 0.3 to 1 mm.

Again, processing is preferably accomplished using laser radiation in the far infrared. Suitable are wavelengths from 980 to 10400 nm with a continuous, non-pulsed operation of the laser. Relevant laser focus diameters are chosen based on the thickness of the starting glass, the power distribution in the focus, and the geometric target size of the haptic feature. Typically, in case of scanning irradiation, focal diameters in a range from 200 µm to 1000 µm are employed. The applied laser power is in a range from about 50 to 200 W. An advancement rate of the laser focus best suited for rapid through heating, in turn, depends on further factors, such as glass thickness, glass type, laser power, and starting temperature of the glass, and will typically be in a range from 300 mm/s to 5000 mm/s. Depending on the contour of the haptic feature, a spatially resolved modulation of speed and/or laser power may be employed.

For example, depending on the task, Gaussian or approximately rectangular power distributions may be employed on the exposed area. The shaping force required for contact-free shaping of the haptic features is again provided by applying a vacuum with pressures from about −0.1 to −0.6 bar, in this case. It is generally preferred for the shaping force, that is the pressure difference of the gas pressure to which the two sides of the sheet-like glass article are subjected in the above example, to be kept constant during the deformation process. It has been found that the shape and depth of the deformation can be better controlled by adjusting a viscosity distribution by precisely adjusting the lateral distribution of the average laser power according to the disclosure.

Figure 9:
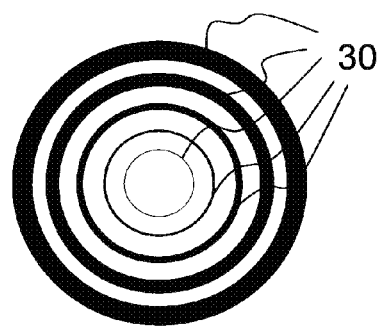
FIGS. 9 and 12 show examples of paths of a laser beam on the surface of a starting glass.

According to one embodiment of the disclosure, for example for producing elevations having a profile similar to the example shown in FIG. 8, a predetermined viscosity distribution is adjusted so that the laser power decreases from the edge to the center of the portion. FIG. 9 illustrates one option for this purpose. Tracks 30 of the laser beam are shown as lines on the surface of the starting glass. The laser beam irradiates the surface of the glass with temporally and spatially varying laser power. Here, the thickness of the lines represents the laser power. For this purpose, the laser beam is guided over the surface of the starting glass in concentric circular tracks using a suitable optic system, for example, a galvanometer scanner. The thickness of the lines, so consequently the average laser power decreases from the periphery towards the center. As a result thereof, viscosity increases from the periphery towards the center. Therefore, the extent of deformation will be smaller in the center than at the periphery. As a result, under the action of a constant force an approximately spherical cap-shaped elevation 10, or complementarily an approximately spherical cap-shaped depression 11 is obtained in this way.

According to another embodiment of the disclosure it is furthermore possible to adjust a predetermined viscosity distribution in a manner so that the laser power increases from the periphery towards the center of the portion. Such a distribution may be suitable for rather small and line-shaped deformations, inter alia. Preferably, such a laser power distribution is used for deformations having a width of not more than 5 mm.

Besides sequential irradiation of the individual deformation zones with oscillating foci advanced by means of galvanometer scanners, it is further conceivable to use fixed optical systems which generate a required appropriate power distribution across the length and width of the respective individual haptic features by decomposing the raw laser beam into many partially overlapping individual beams so as to ensure fast simultaneous irradiation of the glass body for heating the glass up into the respective softening range. Another way to achieve the predetermined viscosity distribution would be to guide the laser beam along a spiral path.

In order to be able to process even glasses having a high thermal expansion coefficient in this manner without causing cracking, thermal preconditioning to the transformation range of the glass or to some temperature range below might furthermore be useful in this application case. This may again be accomplished using laser radiation (e.g. with a large focus diameter in a scanning mode) or by conventional heating technologies, e.g. using a convective heating device.

Figure 10:
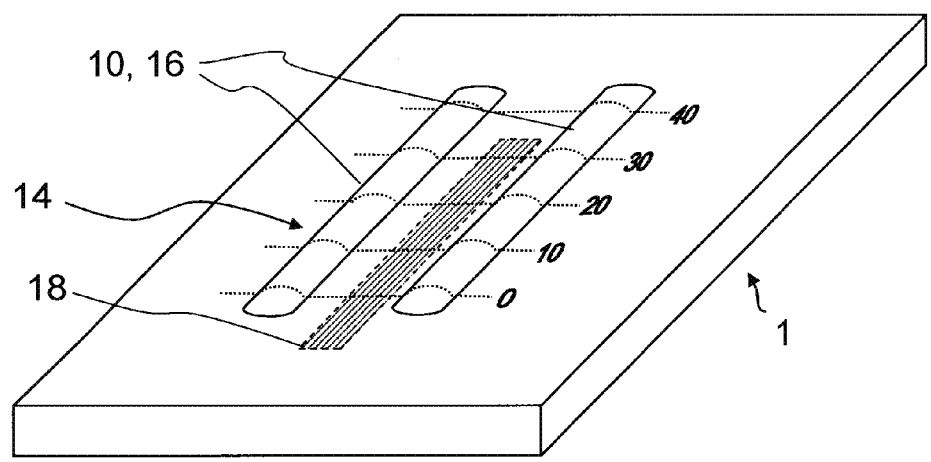
FIG. 10 shows a glass article with line-shaped elevations.

FIG. 10 shows an example of the embodiment described above, namely a tactile aid in form of tactile stripes for haptically assist the operator in orientation, for example on control surfaces. The tactile aid, for example on a control panel of a control unit in the passenger compartment of a vehicle or aircraft, comprises at least one elevation 10. Here, it is provided in form of a line-shaped or elongated elevation 16 which may serve for indicating a slider control in tactile perceptible manner, for example. In the example shown in FIG. 10, the slider control is recognizable by the imprinted scale. Such a slider control may for instance be a volume or brightness control. Advantageously, as shown in the example of FIG. 10, such a control element may as well be provisioned with two line-shaped elevations 16 extending next to each other. In this case, controlling by means of the control element may be accomplished by the operator by moving his finger between and along the line-shaped elevations 16. The actual slider control may be configured as a touch sensor, for example. The touch sensor may even be arranged on the rear side of the glass article. In the example shown in FIG. 10, a sensor 18 is arranged on the rear side of the control field for generating an appropriate drive or control signal, for example for controlling volume or brightness.

The line-shaped elevations 10 or corresponding depressions 11 and the circular elevations of Braille characters have in common that a portion is heated and deformed which has a star-shaped surface in a mathematical sense, while surrounding portions are not deformed and remain in their position. A star-shaped region is a region in which there exists at least one point from which every other point of the region can be reached without leaving the region. The surface of the heated portion may furthermore in particular be a convex region in a mathematical sense. In this case, any point of the region can be connected to any other point of the region by a straight line without leaving the region. A circular region such as that heated by the laser beam for generating elevations 10 for Braille dots is both, star-shaped and convex. The same applies to line-shaped elevations 10 as shown in the example of FIG. 10.

Generally, without being limited to the illustrated exemplary embodiments, according to one embodiment of the disclosure a portion of the starting glass is heated whose surface defines an area of star-shaped, preferably convex topology, and this heated portion is deformed while adjacent regions remain in their position relative to the surface of the starting glass.

Further haptic orientation aids will be described below as exemplary embodiment variations with geometries of circular or annular shape, which may be employed in control surfaces of various electronic devices for local identification of a so-called home button or of a sliders control as well.

Based on a scanning processing mode which is a preferred approach due to its flexibility and geometric diversity, the moving laser beam does not alternately follow identical irradiation paths, but continuously changes orbital radii in form of continuous spirals or concentric rings. For a spherical depression for identifying a 'home button' or, more generally, a digital switching element, the portion to be heated may be heated with concentric paths of the laser beam according to the example shown in FIG. 9. Useful laser focal diameters depend on the glass thickness and the diameter of the feature, inter alia, and preferably range from about 0.3 mm to 2 mm for typical feature dimensions in a range from 5 mm to 50 mm, according to one embodiment of the disclosure. Adequate laser powers resulting therefrom are in a range from 50 W to 600 W. In this case, depending on the selected irradiation strategy, the target geometry may be created simultaneously over the entire surface of the textural feature, for example by way of a high advance rate of the laser beam (1000 mm/s to 20,000 mm/s) with possibly a small focus diameter and medium laser power significantly below the defect threshold of the respective glass, or in form of a continuous shaping front of symmetrically varying portions, preferably at a lower advance rate of approximately 100 mm/s to 1000 mm/s in this case, with laser powers at the damage threshold of the glass (in terms of evaporation, cracks).

As an alternative to a scanning manner of processing, the geometries mentioned herein may as well be created by simultaneous irradiation using an appropriate fixed optical system such as described above for the embodiment 'tactile aid'. Here again, significant reductions in the processing time can be achieved in this way, with very good reproducibility of the laser power distribution in the shaping zone when compared to the heating with a continuously advancing laser beam of a diameter smaller than that of the geometric feature. Such beamforming technologies moreover have a favorable effect with regard to the avoidance of alternating local heating and cooling while the glass temperature is increased into the softening range, which is mainly beneficial in case of materials sensitive to such temperature oscillations, such as glass ceramics.

Figure 11:
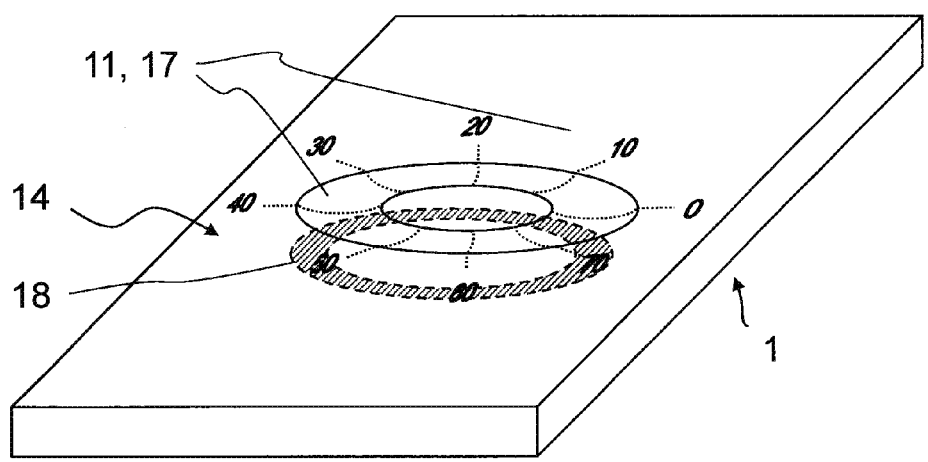
FIG. 11 shows a glass article with a line-shape depression.

FIG. 11 illustrates an exemplary embodiment similar to that of FIG. 10, but with a depression 11 in this case which was produced by the method according to the disclosure. Depression 11 is annular, or in form of a line-shaped depression 17 with the line closed so as to form a ring. Again, linear depression 17 has a sensor 18 associated therewith. Specifically, sensor 18 is arranged on the rear side of the control surface 14, as in the example shown in FIG. 10. In this example, sensor 18 is located below depression 17. This permits to generate a control signal such as a signal for adjusting volume or light brightness by touching the glass article in the depression, in particular by moving a finger along depression 17.

Generally, without being limited to the examples illustrated, according to one embodiment of the disclosure a glass article is in particular provided in form of a control surface 14 which has at least one, preferably two line-shaped elevations 16 extending side by side, or one or more corresponding depressions. Particularly preferably, the one or more line-shaped elevations or depressions have associated therewith at least one sensor for generating a control signal, so that a control signal is generated by touching a sensitive zone. In the example shown in FIG. 10, sensor 18 is disposed on the opposite side of the sheet-like glass article between the two elevations 16.

Figure 12:
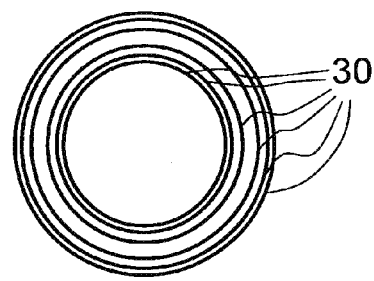

Similarly to FIG. 9, FIG. 12 shows an exemplary embodiment of the tracks of the laser beam in order to achieve a predetermined spatial viscosity distribution to obtain an annular groove 11 corresponding to the example shown in FIG. 11. According to one embodiment of the disclosure, a predetermined viscosity distribution is adjusted by having the average laser power decreasing from the periphery towards the center of the portion, and the variation of the laser power is adjusted through the distance between adjacent tracks 30 of the laser beam. Accordingly, in the center of the portion which is annular in this case, the spacing between adjacent tracks is larger than at the outer and inner edges of the portion.

The disclosure is particularly suitable not only for a single but especially for more deformations in form of elevations 10 with opposite depressions 11 or in form of depressions with opposite elevations 10, depending on which side of the sheet-like glass article is considered. It should be noted in this respect that the individual deformations can be produced with very reproducible dimensions, although no mold is used for the deformations, rather the deformations are generated solely through an external force, in particular in form of a pressure difference, acting on a softened portion.

A uniform height of the elevations 10 is for example important to meet the recommended specifications for Braille characters. In one exemplary embodiment, Braille characters with a total of seventeen Braille dots were prepared. The results are listed in the table below. The target values are recommended feature dimensions for Braille dots. In addition to the target values, the mean value of the feature dimensions of the Braille dots produced according to the disclosure and the standard deviation thereof are listed.

|  | Target value | Mean value | Standard deviation |
| --- | --- | --- | --- |
| Diameter [mm] | 1.5 | 1.534 | 0.027 |
| Distance a [mm] | 2.7 | 2.559 | 0.001 |
| Distance b [mm] | 2.7 | 2.278 | 0.021 |
| Width of Braille symbol [mm] | 6.6 | 6.35 | 0.081 |
| Height of Braille dots [mm] | 0.6-0.7 | 0.6 | 0.060 |

It can be seen that in particular the standard deviation is very small. Especially the height of the Braille dots is very homogeneous, with a standard deviation corresponding to 10% of the mean value. Generally, without being limited to the exemplary embodiment, according to one embodiment of the disclosure a plurality of deformations, preferably a plurality of identical deformations is produced on the glass article with a standard deviation of the height or depth of the elevations 10 or depressions 11 of the deformations of less than 20% of the mean value of the heights or depths.

In order to achieve such a high homogeneity of the shape, it is favorable to reduce as far as possible any mutual influence in terms of heat during the shaping of the elevations 10 or depressions 11. To this end, according to one refinement of the disclosure it is contemplated, if a plurality of deformations are produced in a glass article, that between the points in time at which two closest neighboring deformations are produced, at least one deformation is produced that is not a closest neighbor of the two deformations. It is furthermore possible to observe an interval of at least 5 seconds for the irradiation of two portions for producing closest neighboring deformations, during which interval the irradiation with the laser beam is interrupted.

Figure 13:
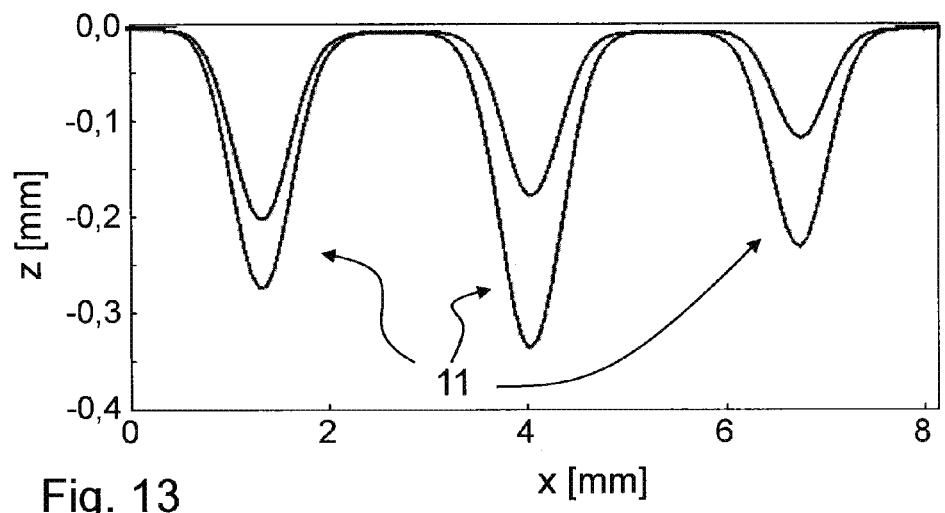
FIGS. 13 and 14 show contour scans across several adjacent deformations.
Figure 14:
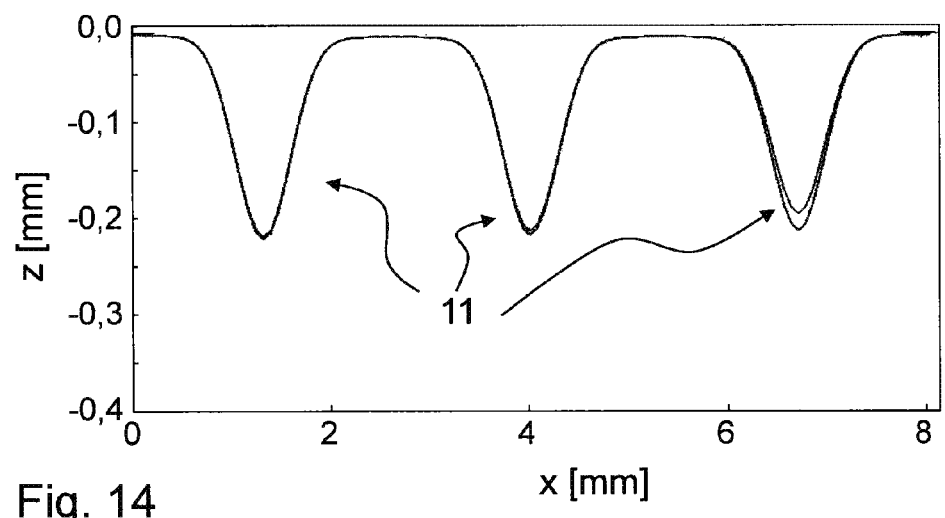

FIGS. 13 and 14 show contour scans across a plurality of adjacent deformations. The deformations in form of depressions are arranged in two adjacent rows of three dots each. Each of the two figures shows two contour scans, and each contour scan was taken along one of the two adjacent rows and accordingly across three depressions 11. In the example shown in FIG. 13, depressions 11 were formed consecutively, directly one after the other. In the example shown in FIG. 14, by contrast, the laser was switched off for a period of 20 seconds after a depression 11 was formed, and only afterwards the next depression 11 was produced by heating the respective portion of the starting glass using the laser and by exposure to a pressure difference. While in the example of FIG. 13 the depths of depressions 11 vary between 125 μm and 350 μm, the depths in the example of FIG. 14 only vary between 200 μm and 220 μm. Thus, a substantially improved homogeneity of the geometric dimensions of the deformations is achieved with the time interval between irradiating the respective portions as explained above.

Figure 15:
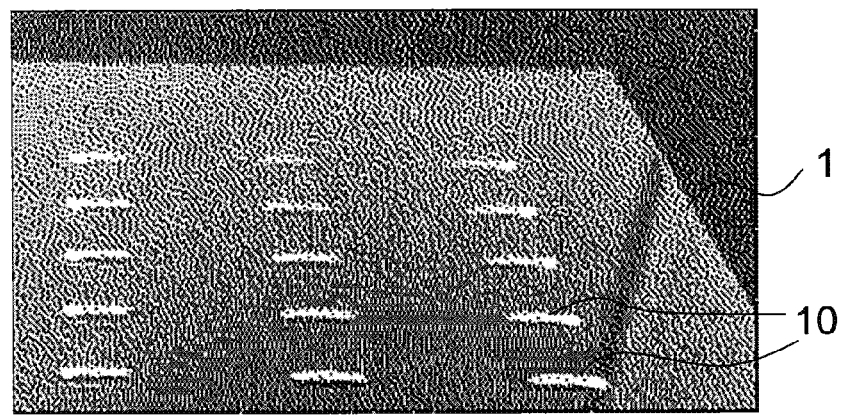
FIG. 15 shows a photograph of a glass article with multiple line-shaped elevations.

FIG. 15 shows, as another example, a sheet-like glass article 1 having a plurality of line-shaped elevations 10 produced according to the disclosure. Elevations 10 have a length of 5 mm and a width of 1 mm. With an average height of 0.423 mm a standard deviation of only 0.037 mm was obtained, which corresponds to 8.5% of the mean value. Such a glass article 1 with haptic line-shaped elevations may be used, for example, as a control panel in motor vehicles.

More generally, the disclosure may be used for shaping control panels, in particular control panel including touch-sensitive sensors as input elements. In this case the deformations of the disclosure serve as haptic indications. Such panels may find application in the automobile sector in the passenger compartment, in other vehicles and aircraft, in elevators, as well as on terminals such as ticket machines.

High reproducibility can be achieved not only with respect to the height. Moreover, in particular high accuracy of shape is enabled. For example, spherical cap-shaped elevations 10 or depressions 11 may be produced with a surface very close to a spherical shape. This is especially true for the convexly curved central area of elevations 10 and the concavely curved central area of depressions.

Figure 16:
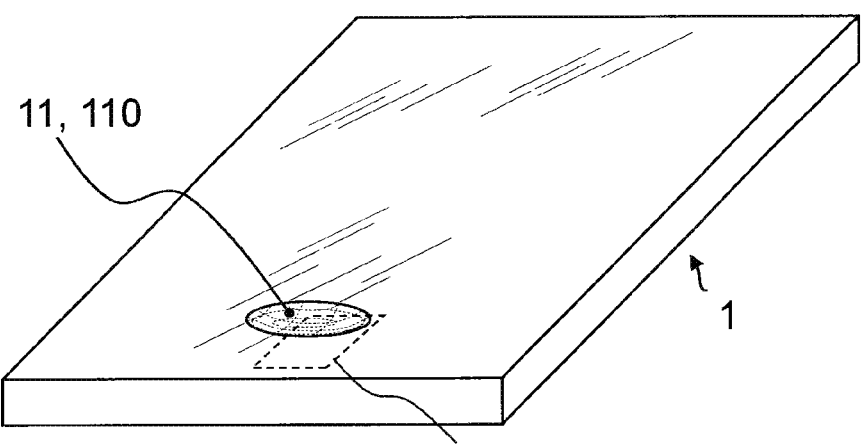
FIG. 16 shows a glass article having a spherical cap-shaped depression.

As an example, FIG. 16 shows a glass article 1 having such a depression 11 in form of a spherical cap-shaped depression 110. Glass article 1 may in particular be a cover glass for the display of a mobile electronic device, in particular a mobile phone or a tablet PC. Depression 110 serves for tactile and visual identification of a digital switching element 19 of a mobile electronic device, for example of a home button for menu navigation. In the illustrated example the switching element 19 is arranged on the opposite side of depression 11.

For a spherical cap-shaped depression 11 for identifying a home button or, more generally, a digital switching element, the portion to be heated may be heated with concentric paths of the laser beam according to the example shown in FIG. 9. In one exemplary embodiment of a depression with a diameter of 11 millimeters and a depth of 0.6 millimeters, a deviation from a spherical or ideal spherical cap shape was measured to be less than 50 µm. According to one embodiment of the disclosure, without being limited to the illustrated example, a depression 11 or an elevation 10 is provided having the shape of a spherical cap with a deviation from an ideal spherical surface of less than 100 µm, preferably less than 75 µm. This applies to the convex central part of an elevation 10 and, correspondingly, to the concave central part of a depression 11.

Figure 17:
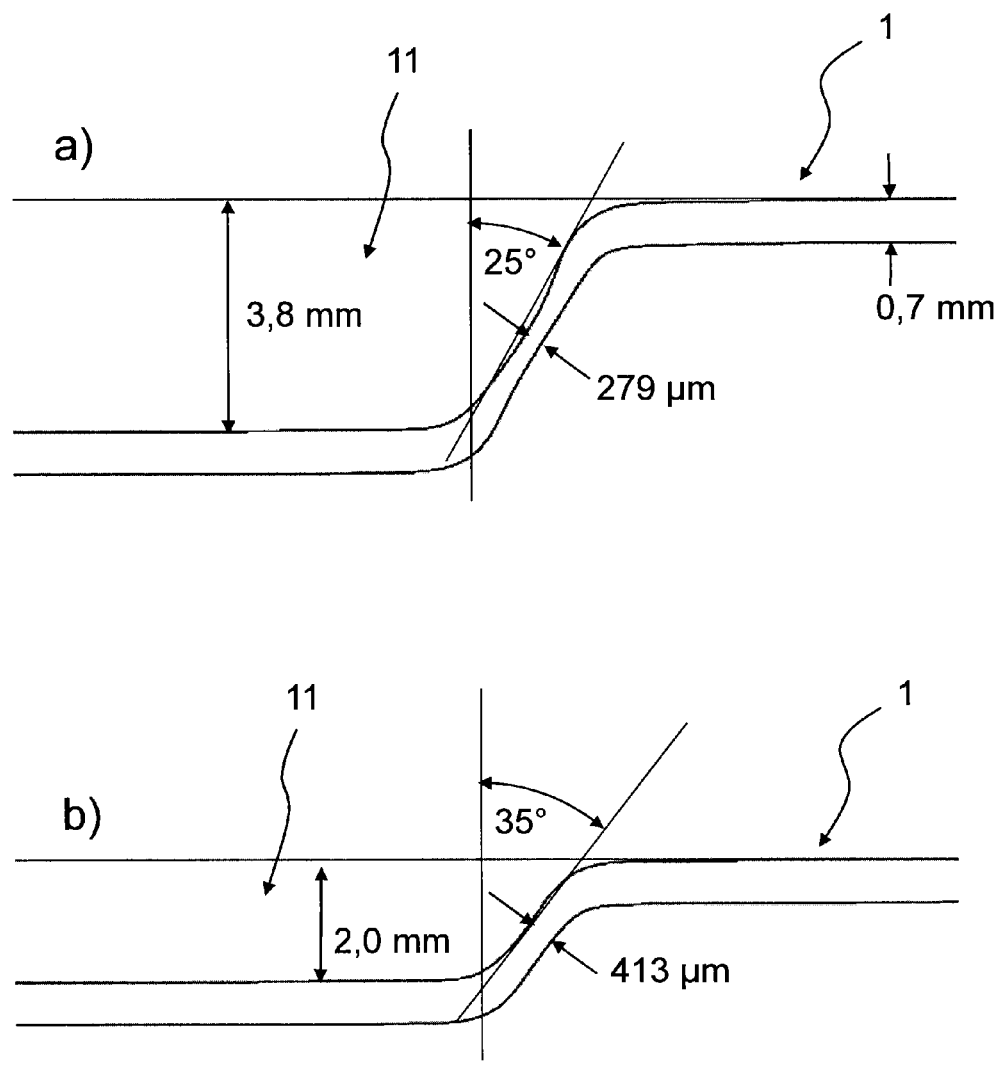
FIG. 17 shows cross-sectional views taken through deformed regions of a glass article having a tray-shaped depression.

As already mentioned above, the disclosure contemplates that the introduced deformations have a height or depth that does not exceed the width of the deformation. As an example, FIG. 17 shows two schematic views a), b), each one representing a cross-sectional view through a different deformation area of a glass article. In these examples, not only were the heated portions deformed and adjacent portions of the starting glass remained in their original position, but like in the example of FIG. 2 a frame-shaped portion was heated and the inner area enclosed by the frame-shaped portion was lowered. However, the features and properties set forth below with respect to the portion heated and softened by the laser also apply in the case that only heated portions are deformed and adjacent areas of the starting glass are left in their original position, as is the case in the examples illustrated in FIGS. 7, 8, 10, 11, 13, 14, and 15. In these latter cases and illustrated examples, the surface in the center of the elevation 10 or depression 11 is typically curved. In the examples shown in FIG. 17, by contrast, the edge region of the deformation transitions into a central planar region. In the example of schematic view a) a depression was produced in a starting glass of 0.7 millimeter thickness, with a depth of 3.8 millimeters. Here, due to the deformation the minimum wall thickness is only 0.279 millimeters, which is less than a factor 0.4 of the thickness of the starting glass. By contrast, the depression 11 of the example shown in schematic view b) has a depth of 2 millimeters. Here, the minimum wall thickness of the deformation is still 0.413 millimeter. Thus, the minimum wall thickness is more than half the thickness of the starting glass. Also, the slope of the deformed portion at the edge of the deformation is different. For the deeper deformation shown in schematic view a), the average angle of the deformed portion to the surface normal of the starting glass is 25°, in the example shown in schematic view b) it is 35°.

In the example shown in FIG. 17 in which the non-heated central region of the deformation is also deformed by being raised or lowered relative to the surrounding glass, the width of the deformation further depends on the width of the central region. On the other hand, if only the portion heated and softened by the laser is deformed, the wall thickness depends not only on the depth or height of the deformation but in particular on the width thereof. Transferred to FIG. 17, a rising flank would be connected to the flank sloping from the right to the left. For such deformations according to the disclosure it is contemplated that the height of elevation 10 or the depth of depression 11 is at least 0.1 mm and is not greater than the width of the deformation, and that the minimum wall thickness of the deformation is at least 0.5 times the thickness of the sheet-like glass article 1. In case of circular or dot-shaped elevations 10 and depressions 11 as illustrated by the examples of FIGS. 7, 8, 13, 14, and 16 it is preferred that the height or depth of the elevation or depression is not greater than half the diameter of the deformation, in order to achieve high stability.

In the example shown in FIG. 8, for instance, the elevation 10 has a width, i.e. diameter in this case, of about 15 mm, measured as the distance between the points from where the height coordinates start to increase. Height is about 0.55 millimeters. Thus, the height is significantly smaller than half the diameter (7.5 mm). In the example shown in FIG. 14, half the diameter of the depressions 11 is approximately 0.75 millimeters. Depth is 0.2 millimeters. Thus, the depressions are shallower by a factor of 0.266 as compared to half the diameter. Also, this ratio is still below the limit of a factor 0.5 as contemplated by the disclosure.

Furthermore, with respect to FIG. 16 an exemplary embodiment of a spherical cap-shaped depression was mentioned, with a diameter of the depression of 11 millimeters and a depth of 0.6 millimeters. Accordingly, the ratio of depth to half the diameter in this case is 0.11 and is therefore also smaller than the limit of 0.5 as contemplated.

A glass article 1 as shown in FIG. 17, especially in schematic view b) thereof, can be used particularly advantageously as a cover glass of a visual, in particular touch-sensitive display, for instance a display for a mobile electronic device such as a display of a mobile phone or a tablet PC. A glass article formed in this manner may as well be used for visual displays of terminals such as ticket machines and for visual displays in control panels such as in vehicles. In this case it is in particular possible to lower the display area relative to the edge. So the lowered central region of the glass article to the left of the deformed region in FIG. 17 would cover the display of such an electronic device, preferably a mobile electronic device. This offers the particular advantage that the cover of the display is better protected from scratching in the region of the visual display, for example when the device is placed somewhere with the cover glass downwards.

Figure 18:
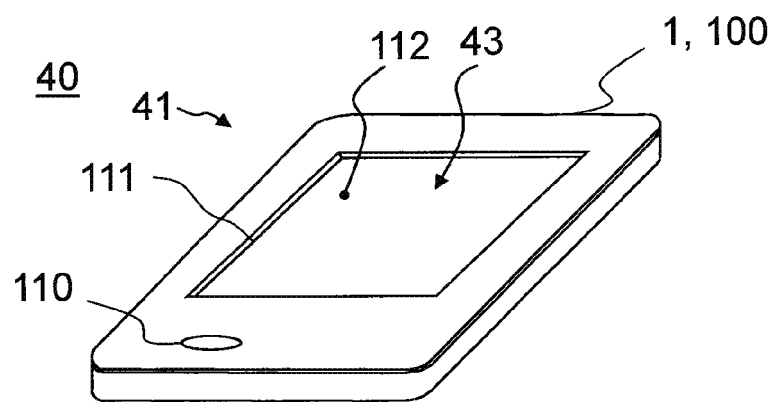
FIG. 18 shows a mobile electronic device comprising a glass article having a tray-shaped depression.

FIG. 18 shows an exemplary embodiment of such a mobile electronic device 40 in form of a mobile phone 41. Mobile phone 41 has a visual touch-sensitive display 43 which is covered by a cover glass 100 in form of a sheet-like glass article 1 according to the disclosure. Cover glass 100 now has a depression 11 which is formed as a tray-shaped depression 111 with a flat bottom 112. This bottom 112 covers the display 43. Depression 111 is produced by heating a frame-shaped portion using a laser until it softens, and the region enclosed by the frame-shaped portion is raised or lowered relative to the surrounding regions of the starting glass by applying a force. As described above, the force is preferably produced by a pressure difference in gas pressure between the two sides of the starting glass. Furthermore preferably, deforming is accomplished under a constant force, that is in particular under the action of a constant pressure difference.

Additionally, the cover glass 100 may have a spherical cap-shaped depression 110 as illustrated and described in FIG. 16, which haptically indicates the position of a digital switching element such as in particular a home button.

The depth of depression 111 is preferably not set in relation to its width in this case, because the width largely depends on the width of the flat central area 112 which in turn does not have any influence on the glass thickness at the edge of the deformation. As is apparent from FIG. 17, however, the minimum glass thickness depends, inter alia, on the ratio of the depth of the depression to the glass thickness of the starting glass. In order to ensure good stability, it is preferably contemplated in this case that the depth of the depression 111 is less than 4.5 times the glass thickness of the cover glass. For comparison, in the example shown in schematic view a), this ratio is 5.4, while in the example shown in schematic view b) the ratio of glass thickness to depth is only 2.86, so that a good mechanical stability is ensured. On the other hand, in order to achieve good protection against scratching in the central region 112, the depression has a depth of at least 0.1 millimeters. Like in the other embodiments of the disclosure, the edge of the depression has a convex curvature caused by the shaping method of the disclosure, and towards the center this convex curvature transitions into a concave curvature, which concave curvature preferably transitions into the flat bottom of the depression.

Accordingly, without being limited to the specific exemplary embodiments, the disclosure furthermore generally relates to a sheet-like cover glass 100 for a visual, in particular touch-sensitive display 43, preferably a visual, in particular touch-sensitive display of a mobile electronic device 40, and to a preferably mobile electronic device 40 equipped with the cover glass 100, wherein the cover glass 100 has a tray-shaped depression 111, wherein the depression 111 has a flat bottom 112 for covering the display, and wherein the depression 111 has a depth of at least 0.1 millimeters and a maximum depth corresponding to four and a half times the thickness of the cover glass, and wherein the edge region of the depression 111 is convexly curved and wherein inwardly towards the flat bottom 112 the convex curvature transitions into a concave curvature.

The curvature of the edge region with a fire-polished surface makes this region more resistant to shock and scratches and improves mechanical stability. In conjunction with the depression 111, a display is created that is particularly insensitive to scratching and shock.

Furthermore, the cover glass may additionally have haptic features according to the disclosure for example in form of the 'home button' illustrated in FIG. 18, or other haptic features, for example in form of line-shaped elevations 16.

Also, the shape of the elevation or depression produced by the method according to the disclosure with transitioning convexly and concavely curved regions is particularly advantageous in terms of chemical tempering. The rounded surfaces lead to a more uniform distribution of forces of the compressive stresses generated by chemical tempering and reduce the risk of damage that goes deeper than the zones of compressive stress and so would greatly reduce strength. This applies not only to the specific example of a tray-shaped depression in a cover glass of a visual display as shown in FIG. 18, but to all embodiments of the disclosure described herein. Therefore, according to one embodiment of the disclosure it is generally contemplated that the glass article 1 of the disclosure may be chemically tempered. In this case, the chemical tempering is in particular performed after the deformation has been produced.

It will be apparent to those skilled in the art that the disclosure is not limited to the illustrated exemplary embodiments but may be varied in many ways, in particular by combining the features of the individual exemplary embodiments. For example, a variation of the laser power as shown in FIG. 9 may likewise be used for the exemplary embodiment with a annularly heated starting glass shown in FIG. 12, and vice versa, a variation of the spacing of the tracks 30 may likewise be used to produce the desired viscosity distribution for a circular, in particular spherical cap-shaped depression according to FIG. 9. The depressions of the disclosure with continuously curved surface may for instance be combined with tray-shaped depressions as shown in FIGS. 2 and 3, or 18. Furthermore, if suitable glasses are used, the glass articles of the disclosure may be ceramized and thus converted into corresponding glass ceramic articles. These glass ceramic articles will then likewise exhibit all features of the glass articles described herein with respect to the geometry and nature of the surface. Therefore, according to one embodiment the disclosure further relates to a glass ceramic article obtainable by ceramization of a glass article according to the disclosure.

While the present disclosure has been described with reference to one or more particular embodiments, it will be understood by those skilled in the art that various changes may be made and equivalents may be substituted for elements thereof without departing from the scope thereof. In addition, many modifications may be made to adapt a particular situation or material to the teachings of the disclosure without departing from the scope thereof. Therefore, it is intended that the disclosure not be limited to the particular embodiment(s) disclosed as the best mode contemplated for carrying out this disclosure.

List of Reference Numerals:

| | |
|---|---|
| 1 | Shaped flat glass (shaped glass article of predefined geometry) |
| 2 | Medium viscosity range ($10^7$ to $10^{13}$ dPa·s) |
| 3 | Low viscosity range ($10^4$ to $10^8$ dPa·s) |
| 4 | Medium viscosity range ($10^7$ to $10^{13}$ dPa·s) |
| 5 | Bending viscosity ($10^7$ to $10^{12}$ dPa·s) |
| 6 | Transition from low to bending viscosity |
| 7 | Support |
| 8 | High viscosity range ($>10^{12}$ dPa·s) |
| 10 | Elevation |
| 11 | Depression |
| 12 | Braille character |
| 14 | Control field |
| 16 | Line-shaped elevation |
| 17 | Line-shaped depression |
| 18 | Sensor |
| 19 | Digital switching element |
| 20 | Peripheral indentation |
| 30 | Track of laser beam |
| 40 | Mobile electronic device |
| 41 | Mobile phone |
| 110 | Spherical cap-shaped depression |
| 111 | Tray-shaped depression with flat bottom |
| 112 | Bottom of 111 |
| A-A | Section line |
| B, C | Transition areas between bending lines |

The invention claimed is:

1. A method for producing, without a mold, a shaped glass article having a predefined geometry, the method comprising at least the steps of:

providing a starting glass;

supporting the starting glass;

heating a portion of the starting glass so as to obtain, in the portion, a predetermined spatial viscosity distribution of the starting glass from $10^9$ to $10^4$ dPa·s, and so that at points where the starting glass is supported a viscosity of the starting glass does not fall below $10^{13}$ dPa·s, wherein the heating is accomplished using at least one laser beam; and deforming the portion through action of a predetermined contact-free external force until the predefined geometry of the shaped glass article is obtained, wherein the portion is raised or lowered with respect to surrounding regions so that a local elevation or depression is obtained, wherein the predetermined spatial viscosity distribution is adjusted by causing a power level of the at least one laser beam to decrease from an edge of the portion towards a center of the portion, wherein, by controlling the predetermined spatial viscosity distribution, the predetermined contact-free external force deforms the portion so that a minimum curvature radius at the edge is smaller than the minimum curvature radius in the center, and wherein the center is convex when the portion is the local elevation and is concave when the portion is the local depression.

2. The method of claim 1, wherein only the portion is deformed and adjacent regions of the starting glass remain in an original position.

3. The method of claim 1, wherein the heating of the portion is effected by locally and/or temporally varying a power of the at least one laser beam.

4. The method of claim 3, further comprising producing at least two deformations laterally spaced from one another, wherein the power of the laser beam is reduced or switched off while the laser beam sweeps over a space between the portions that are heated by the laser beam to produce the at least two deformations.

5. The method of claim 1, further comprising laterally distributing the laser beam on a surface of the starting glass with an optic system so that the predetermined spatial viscosity distribution is achieved.

6. The method of claim 1, further comprising keeping constant, during the deforming step, the predetermined external force and a pressure difference of a gas pressure between two opposite sides of the starting glass.

7. The method of claim 1, wherein the portion of the starting glass comprises a surface that defines a region of a star-shape.

8. The method of claim 1, wherein the starting glass is flat glass.

9. The method of claim 1, wherein the starting glass is selected from the group consisting of a soda-lime glass, a borosilicate glass, and an aluminosilicate glass.

10. The method of claim 1, further comprising preheating the starting glass, wherein the preheating is effected at least in a region that includes the portion of the starting glass that is to be heated for producing the deformation, wherein the preheating is performed up to a temperature of at least 300° C. but remains below the softening point temperature at which the glass reaches a viscosity of $10^{7.6}$ dPa·s.

11. The method of claim 1, wherein the heating has heating parameters comprising the viscosity of the starting glass to be obtained in the portion, and deformation parameters comprising deformation time, are chosen so that deformation ceases when the starting glass has assumed the predefined geometry.

12. The method of claim 1, wherein the heating further comprises using a burner or by infrared radiation.

13. The method of claim 12, wherein the portion is scanned with a frequency of the laser beam of at least 2 Hz.

14. The method of claim 1, wherein the portion is heated simultaneously or in a temporal sequence.

15. The method of claim 1, wherein the heating step is performed so that a predetermined thermal gradient is adjusted between the portion and other regions of the starting glass.

16. The method of claim 15, further comprising the step of measuring a thermal gradient with a thermal imaging sensor.

17. The method of claim 1, further comprising the step of measuring an amount of deformation during the deforming step with optical sensors and/or acoustic sensors.

18. The method of claim 1, wherein during the deforming step, a plurality of deformations are produced in the shaped glass article, and wherein between points in time at which two closest neighboring deformations are produced, at least one deformation is produced that is not a closest neighbor of the two deformations; or wherein between irradiation of two portions for producing closest neighboring deformations a time interval of at least 5 seconds is observed, during which interval the irradiation with the laser beam is interrupted.

19. The method of claim 1, wherein the external force is exerted by a pressure difference across the starting glass.

20. The method of claim 19, wherein the pressure difference is an overpressure and/or an underpressure on the portion.

21. The method of claim 1, wherein the portion has a shape selected from the group consisting of a circular elevation or depression, line-shaped elevation or depression, and a tray-shaped elevation or depression with a flat bottom.

* * * * *